US012703061B2

(12) United States Patent
Matsuo et al.

(10) Patent No.: US 12,703,061 B2
(45) Date of Patent: Aug. 11, 2026

(54) POLISHING APPARATUS

(71) Applicants: EBARA CORPORATION, Tokyo (JP); Kyushu Institute of Technology, Fukuoka (JP)

(72) Inventors: Hisanori Matsuo, Tokyo (JP); Keisuke Suzuki, Fukuoka (JP)

(73) Assignees: EBARA CORPORATION, Tokyo (JP); Kyushu Institute of Technology, Fukuoka (JP)

( * ) Notice: Subject to any disclaimer, the term of this patent is extended or adjusted under 35 U.S.C. 154(b) by 387 days.

(21) Appl. No.: 17/780,885

(22) PCT Filed: Nov. 30, 2020

(86) PCT No.: PCT/JP2020/044497

§ 371 (c)(1),
(2) Date: May 27, 2022

(87) PCT Pub. No.: WO2021/112034

PCT Pub. Date: Jun. 10, 2021

(65) Prior Publication Data

US 2023/0026751 A1 Jan. 26, 2023

(30) Foreign Application Priority Data

Dec. 3, 2019 (JP) ................................ 2019-218859
Nov. 13, 2020 (JP) ................................ 2020-189518

(51) Int. Cl.
*B24B 49/12* (2006.01)
*B24B 37/005* (2012.01)
*H10P 72/00* (2026.01)

(52) U.S. Cl.
CPC ............ *B24B 49/12* (2013.01); *B24B 37/005* (2013.01); *H10P 72/0428* (2026.01)

(58) Field of Classification Search
CPC ....... B24B 37/005; B24B 49/12; B24B 37/34; B24B 37/00; B24B 37/04; B24B 37/11;
(Continued)

(56) References Cited

U.S. PATENT DOCUMENTS 7,088,458 B1 * 8/2006 Wegmann ................ G01J 9/02 356/124
2002/0080365 A1 6/2002 Monshouwer et al.
(Continued)

FOREIGN PATENT DOCUMENTS

CN 105390410 A 3/2016
CN 110026883 A 7/2019
(Continued)

OTHER PUBLICATIONS

Sarcone, Gianni A. et al., Optical Effects: Moiré Patterns 2, Radiating optical effect, https://web.archive.org/web/20180221175858/https://www.archimedes-lab.org/moire_patterns2.html, Feb. 21, 2018 (Year: 2018).*

(Continued)

*Primary Examiner* — Monica S Carter
*Assistant Examiner* — Kent N Shum
(74) *Attorney, Agent, or Firm* — BakerHostetler

(57) ABSTRACT

The present invention relates to a polishing apparatus and a polishing method for polishing a workpiece, such as a wafer on which a pattern is formed, on a polishing pad, and more particularly, relates to a polishing apparatus and a polishing method for detecting a geometric element of a pattern, such as a pitch. The polishing apparatus includes: a polishing table (3) configured to support a polishing pad (2); a polishing head (1) configured to press a workpiece (W), having a pattern formed therein, against the polishing pad (2) and polish a surface of the workpiece (W), an imaging device (20) disposed in the polishing table (3) and config-
(Continued)

ured to generate an image including at least the pattern of the workpiece (W), and an image analysis system (30) configured determining a geometric element of the pattern of the workpiece (W) based on the image.

5 Claims, 11 Drawing Sheets

(58) Field of Classification Search
CPC ....... B24B 37/10; B24B 37/013; B24B 37/30; H01L 21/304; H01L 21/67092; H01L 21/67; H01L 21/027; H01L 21/30; G01B 11/00
See application file for complete search history.

(56) References Cited

U.S. PATENT DOCUMENTS

| | | | | |
|---|---|---|---|---|
| 2002/0137434 | A1 | 9/2002 | Choi et al. | |
| 2007/0077671 | A1 | 4/2007 | David et al. | |
| 2008/0094629 | A1* | 4/2008 | Wu | G03F 9/7003 356/401 |
| 2013/0260640 | A1* | 10/2013 | Chen | B24B 49/12 451/340 |
| 2015/0235880 | A1* | 8/2015 | Inada | G06T 7/0004 348/87 |
| 2017/0337705 | A1* | 11/2017 | Bendall | G01B 11/24 |
| 2019/0285996 | A1* | 9/2019 | Shibayama | B29C 43/04 |
| 2019/0344398 | A1* | 11/2019 | Watanabe | B24B 37/013 |
| 2020/0209164 | A1* | 7/2020 | Ueyama | H01L 21/68 |
| 2020/0301293 | A1* | 9/2020 | Mitsugi | G03F 1/42 |

FOREIGN PATENT DOCUMENTS

| | | | | |
|---|---|---|---|---|
| JP | H07-276206 | A | | 10/1995 |
| JP | 2002-289563 | A | | 10/2002 |
| JP | 2005-340718 | A | | 12/2005 |
| JP | 2009-094407 | A | | 4/2009 |
| JP | 2010-064220 | A | | 3/2010 |
| JP | 2011-211093 | A | | 10/2011 |
| JP | 2013-146831 | A | | 8/2013 |
| JP | 2013240846 | A | * | 12/2013 |
| JP | 2005-217433 | A | | 8/2015 |
| KR | 2016-0126705 | A | | 11/2016 |
| TW | 200731384 | A | | 8/2007 |
| WO | WO 2002/018100 | A2 | | 3/2002 |
| WO | WO 2002/052350 | A1 | | 7/2002 |

OTHER PUBLICATIONS

PCT/JP2020/044497; Int'l Search Report; dated Jan. 19, 2021; 4 pages.

* cited by examiner

POLISHING APPARATUS

TECHNICAL FIELD

The present invention relates to a polishing apparatus and a polishing method for polishing a workpiece, such as a wafer, on which a pattern is formed, on a polishing pad, and more particularly to a polishing apparatus and a polishing method for detecting a geometric element of a pattern, such as a pitch.

Further, the present invention relates to a polishing apparatus and a polishing method for polishing a workpiece, such as a wafer, on which a pattern is formed, on a polishing pad, and more particularly to a technique of determining a polishing end point of the workpiece.

BACKGROUND ART

Polishing of a wafer is generally performed using a chemical mechanical polishing apparatus (CMP apparatus). This CMP apparatus is configured to polish a surface of the wafer by sliding contact of the wafer and a polishing pad while supplying a slurry onto the polishing pad attached to a polishing table. The wafer to be polished by the CMP apparatus generally has a pattern that constitutes an interconnect structure. During polishing of the wafer, the wafer surface on which the pattern is formed is pressed against the polishing pad, and a film (insulating film, metal film, etc.) forming the wafer surface is polished.

CITATION LIST

Patent Literature

Patent document 1: Japanese laid-open patent publication No. 2004-517476

SUMMARY OF INVENTION

Technical Problem

Polishing conditions of the wafer may vary depending on a geometric element of the pattern, such as a pitch. For example, a polishing load on the wafer may be increased in a region where the pattern pitch is small (a pattern density is high), and a polishing load on the wafer may be decreased in a region where the pattern pitch is large (a pattern density is low). However, since the geometric element of the pattern is unknown, the polishing condition could not be optimized based such a pattern.

Techniques of monitoring the wafer surface during the polishing of the wafer include an optical polishing monitoring system. This system directs light to the wafer surface, estimates a film thickness at a measurement point based on a spectrum of reflected light from the wafer surface, and detects a polishing end point of the wafer. However, since a complicated and fine pattern is formed on the wafer, light interference due to the pattern occurs, which makes it difficult to accurately estimate the film thickness.

Further, in an interconnect forming process, such as a damascene method, the polishing end point is a point in time at which removal of an excessive film forming the wafer surface is finished and a pattern has clearly appeared. Therefore, it is desirable to directly observe the appearance of the pattern and detect the polishing end point. In order to directly observe the appearance of the pattern, a microscopic system capable of observing with ultra-high magnification is generally required. Such a system is constituted by a complicated and precise optical system, and therefore it is not practical to incorporate such microscopic system into the CMP apparatus which requires the observation under a dynamic environment.

Thus, the present invention provides a polishing apparatus and a polishing method capable of obtaining a geometric element, such as a pitch of a pattern formed on a workpiece, such as a wafer.

Further, the present invention provides a polishing apparatus and a polishing method capable of directly monitoring an appearance of a pattern of a workpiece, such as a wafer, without using a high-magnification and precise microscopic system and capable of detecting an accurate polishing end point.

Solution to Problem

In an embodiment, there is provided a polishing apparatus comprising: a polishing table configured to support a polishing pad; a polishing head configured to press a workpiece, having a pattern formed thereon, against the polishing pad and polish a surface of the workpiece; an imaging device disposed in the polishing table and configured to generate an image including at least the pattern of the workpiece; and an image analysis system configured to determine a geometric element of the pattern of the workpiece based on the image.

In an embodiment, the polishing apparatus further comprises a pattern magnifying device configured to visually magnify the pattern of the workpiece.

In an embodiment, the pattern magnifying device comprises a lattice having a reference pattern formed therein, the reference pattern having a predefined shape and dimensions, and the image analysis system is configured to determine the geometric element of the pattern of the workpiece based on a moire pattern appearing on the image due to superimposition of the pattern of the workpiece and the reference pattern.

In an embodiment, the image analysis system is configured to measure a line width of the moire pattern appearing on the image and calculate a pitch of the pattern of the workpiece from the line width of the moire pattern and the geometric element of the reference pattern.

In an embodiment, the image analysis system is configured to: obtain the image from the imaging device; compare the moire pattern on the image with reference moire patterns on a plurality of reference images; determine a reference image having a reference moire pattern that most matches the moire pattern on the image; and determine a geometric element of a pattern associated with the determined reference image.

In an embodiment, the polishing apparatus further comprises: a first prism and a second prism disposed in the polishing table; and a light source facing the first prism, wherein the imaging device faces the second prism, the first prism is arranged so as to split light emitted by the light source into a first light that passes through the lattice to the workpiece and a second light that is reflected by the lattice, and the second prism is arranged so as to superimpose the first light reflected by the workpiece and the second light reflected by the lattice, and to direct the first light and the second light, which are superimposed, to the imaging device.

In an embodiment, the polishing apparatus further comprises a beam splitter and a light source disposed in the polishing table, wherein the light source and the lattice are arranged symmetrically with respect to the beam splitter, the imaging device faces the beam splitter, and the beam splitter is arranged so as to split light emitted by the light source into a first light reflected by the beam splitter and a second light passing through the beam splitter, direct the first light to the workpiece, and direct the second light to the lattice.

In an embodiment, the reference pattern is a concentric pattern or a radial pattern.

In an embodiment, there is provided a polishing method comprising: rotating a polishing table together with a polishing pad; pressing a workpiece, having a pattern formed thereon, against the polishing pad to polish a surface of the workpiece; generating an image including at least the pattern of the workpiece by an imaging device disposed in the polishing table; and determining a geometric element of the pattern of the workpiece based on the image.

In an embodiment, a pattern magnifying device configured to visually magnify the pattern of the workpiece is disposed in the polishing table.

In an embodiment, the pattern magnifying device comprises a lattice having a reference pattern formed therein, the reference pattern having a predefined shape and dimensions, and the determining the geometric element of the pattern of the workpiece based on the image comprises determining the geometric element of the pattern of the workpiece based on a moire pattern appearing on the image due to superimposition of the pattern of the workpiece and the reference pattern.

In an embodiment, the determining the geometric element of the pattern of the workpiece based on the image comprises measuring a line width of the moire pattern appearing on the image, and calculating a pitch of the pattern of the workpiece from the line width of the moire pattern and the geometric element of the reference pattern.

In an embodiment, the determining the geometric element of the pattern of the workpiece based on the image comprises: obtaining the image from the imaging device; comparing the moire pattern on the image with reference moire patterns on a plurality of reference images; determining a reference image having a reference moire pattern that most matches the moire pattern on the image; and determining a geometric element of a pattern associated with the determined reference image.

In an embodiment, the reference pattern is a concentric pattern or a radial pattern.

In an embodiment, there is provided a polishing apparatus comprising: a polishing table configured to support a polishing pad; a polishing head configured to press a workpiece, having a pattern formed thereon, against the polishing pad and polish a surface of the workpiece; a lattice disposed in the polishing table and having a reference pattern formed therein; an imaging device disposed in the polishing table and configured to generate an image including the pattern of the workpiece and the reference pattern; an image analysis system configured to determine a polishing end point of the workpiece based on a moire pattern appearing on the image due to superimposition of the pattern of the workpiece and the reference pattern.

In an embodiment, the image analysis system is configured to determine the polishing end point of the workpiece based on a sharpness of the moire pattern on the image.

In an embodiment, the image analysis system is configured to determine the polishing end point of the workpiece at which the sharpness of the moire pattern no longer changes.

In an embodiment, the image analysis system is configured to calculate an index numerical value indicating the sharpness of the moire pattern, calculate a rate of change in the index numerical value, detect a point in time at which the rate of change exceeds a first threshold value, and then determine the polishing end point at which the rate of change falls below a second threshold value.

In an embodiment, the index numerical value is a numerical value expressed by a modulation transfer function.

In an embodiment, there is provided a polishing method comprising: rotating a lattice and a polishing table together with a polishing pad, the lattice having a reference pattern formed therein; pressing a workpiece, having a pattern formed thereon, against the polishing pad to polish a surface of the workpiece; generating, by an imaging device, an image of the pattern of the workpiece and the reference pattern which are superimposed, the imaging device being disposed in the polishing table; and determining a polishing end point of the workpiece based on a moire pattern appearing on the image.

In an embodiment, the determining the polishing end point of the workpiece based on the moire pattern appearing on the image comprises determining the polishing end point of the workpiece based on a sharpness of the moire pattern on the image.

In an embodiment, the determining the polishing end point of the workpiece based on the sharpness of the moire pattern on the image comprises determining the polishing end point of the workpiece at which the sharpness of the moire pattern no longer changes.

In an embodiment, the determining the polishing end point of the workpiece at which the sharpness of the moire pattern no longer changes comprises calculating an index numerical value indicating the sharpness of the moire pattern, calculating a rate of change in the index numerical value, detecting a point in time at which the rate of change exceeds a first threshold value, and then determining the polishing end point at which the rate of change falls below a second threshold value.

In an embodiment, the index numerical value is a numerical value expressed by a modulation transfer function.

Advantageous Effects of Invention

According to the present invention, the geometric element of the pattern of the workpiece can be obtained based on the image of the pattern of the workpiece.

Further, according to the present invention, the polishing end point of the workpiece can be determined accurately based on the appearance of the moire pattern on the image.

DESCRIPTION OF EMBODIMENTS

Embodiments of the present invention will now be described with reference to the drawings.

In the embodiments described below, a workpiece to be polished is a wafer on which a pattern is formed in advance, but the present invention is not limited to the following embodiments, and the workpiece may be a panel, a square substrate, a glass substrate, etc., on which a pattern is formed in advance.

Figure 1:
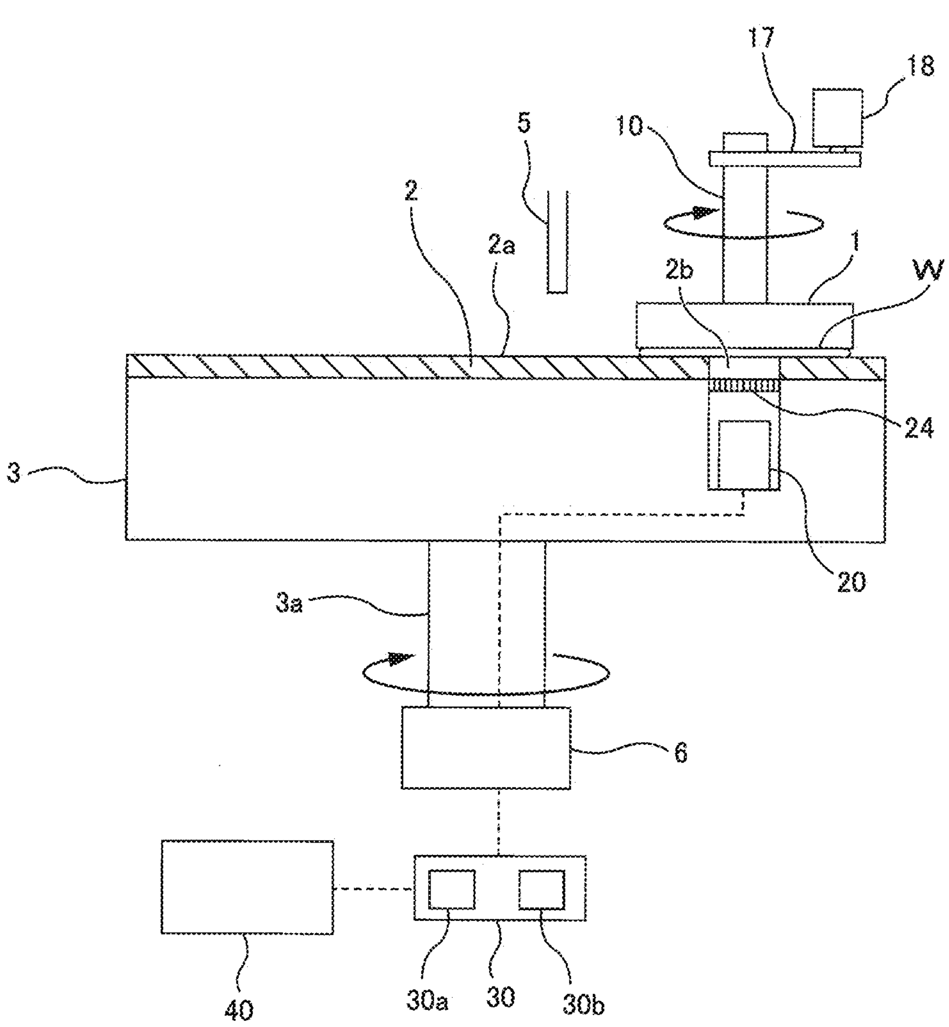
FIG. 1 is a diagram showing an embodiment of a polishing apparatus for polishing a wafer, which is an example of a workpiece.

FIG. 1 is a diagram showing an embodiment of a polishing apparatus for polishing a wafer, which is an example of a workpiece. As shown in FIG. 1, the polishing apparatus includes a polishing table 3 configured to support a polishing pad 2, a polishing head 1 configured to press a wafer W, which is an example of the workpiece, against the polishing pad 2, a table motor 6 configured to rotate the polishing table 3 together with the polishing pad 2, and a slurry supply nozzle 5 configured to supply a slurry onto the polishing pad 2.

The polishing head 1 is coupled to a head shaft 10, and the polishing head 1 is capable of rotating together with the head shaft 10. The head shaft 10 is coupled to a polishing-head motor 18 through a coupling device 17, such as a belt, so that the head shaft 10 is rotated by the polishing-head motor 18. This rotation of the head shaft 10 is transmitted to the polishing head 1 to rotate the polishing head 1 in a direction indicated by an arrow. A table shaft 3*a* of the polishing table 3 is coupled to the table motor 6, and the table motor 6 is configured to rotate the polishing table 3 and the polishing pad 2 in a direction indicated by an arrow.

Polishing of the wafer W is performed as follows. The slurry supply nozzle 5 supplies the slurry onto a polishing surface 2*a* of the polishing pad 2 on the polishing table 3, while the polishing table 3 and the polishing head 1 are rotated in the directions indicated by the arrows in FIG. 1. The polishing pad 2 is rotated together with the polishing table 3. The wafer W is pressed against the polishing surface 2*a* of the rotating polishing pad 2 by the polishing head 1 in the presence of the slurry on the polishing pad 2. The surface of the wafer W is polished by a chemical action of the slurry and mechanical actions of abrasive grains contained in the slurry and the polishing pad 2.

The polishing apparatus includes an imaging device 20 disposed in the polishing table 3, and a lattice 24, which is a pattern magnifying device, disposed between the polishing head 1 and the imaging device 20. The imaging device 20 is arranged so as to face a surface (patterned surface), to be polished, of the wafer W, and is configured to generate an image including at least a pattern formed on the wafer W. The polishing apparatus further includes an image analysis system 30 configured to determine a geometric element of the pattern of the wafer W based on the image generated by the imaging device 20, and an operation controller 40 configured to determine a polishing condition for the wafer W based on the geometric element of the pattern of the wafer W determined by the image analysis system 30.

The imaging device 20 is a camera having an image sensor, such as a CCD sensor or a CMOS sensor. The imaging device 20 is arranged so as to face upward, i.e., face the surface (patterned surface), to be polished, of the wafer W on the polishing pad 2. The imaging device 20 may include an illuminator configured to illuminate the surface (patterned surface), to be polished, of the wafer W.

As will be described later, the image analysis system 30 includes a memory 30*a* storing programs therein for determining the geometric element of the pattern of the wafer W based on a moire pattern appearing on an image, and an arithmetic device 30*b* configured to perform arithmetic operations according to instructions contained in the programs. The memory 30*a* includes a main memory, such as a RAM, and an auxiliary memory, such as a hard disk drive (HDD) or a solid-state drive (SSD). Examples of the arithmetic device 30*b* include a CPU (central processing unit) and a GPU (graphic processing unit). However, the specific configuration of the image analysis system 30 is not limited to these examples.

The image analysis system 30 is composed of at least one computer. The at least one computer may be one server or a plurality of servers. The image analysis system 30 may be an edge server coupled to the imaging device 20 by a communication line, or may be a cloud server coupled to the imaging device 20 by a communication network, such as the Internet or a local area network. Alternatively, the image analysis system 30 may be a fog computing device (gateway, fog server, router, etc.) installed in a network coupled to the imaging device 20.

The lattice 24 has a reference pattern formed therein. The reference pattern has a predefined shape and dimensions. In one embodiment, the lattice 24 has a transparent plate and a patterned layer formed on the transparent plate. The transparent plate is made of a light-transmitting material, such as glass or transparent resin, while the patterned layer is made of a light-blocking material. The reference pattern is formed in the patterned layer.

The lattice 24 is arranged in the polishing table 3. More specifically, the lattice 24 is arranged directly above the imaging device 20, and the imaging device 20 is arranged so as to face the lattice 24. The lattice 24 is parallel to the polishing surface 2*a* of the polishing pad 2 (i.e., parallel to the surface, to be polished, of the wafer W on the polishing pad 2). A through-hole 2*b* is formed in the polishing pad 2. The through-hole 2*b* is aligned with the lattice 24 and the imaging device 20. Therefore, the imaging device 20 can generate the image of the pattern of the wafer W on the polishing pad 2 through the through-hole 2*b* and the lattice 24 during polishing of the wafer W. A part of the lattice 24 may be located in the through-hole 2*b* of the polishing pad 2.

In one embodiment, the imaging device 20 may generate the image of the pattern of the wafer W on the polishing pad 2 through the through-hole 2*b* and the lattice 24 before polishing of the wafer W. Specifically, with the polishing table 2 and the polishing head 1 not rotating, the polishing head 1 presses the surface (patterned surface), to be polished, of the wafer W against the polishing surface 2*a* of the polishing pad 2 to cover the through-hole 2*b* with the wafer W. The imaging device 20 generates the image of the pattern of the wafer W on the polishing pad 2 through the through-hole 2*b* and the lattice 24.

Figure 2:
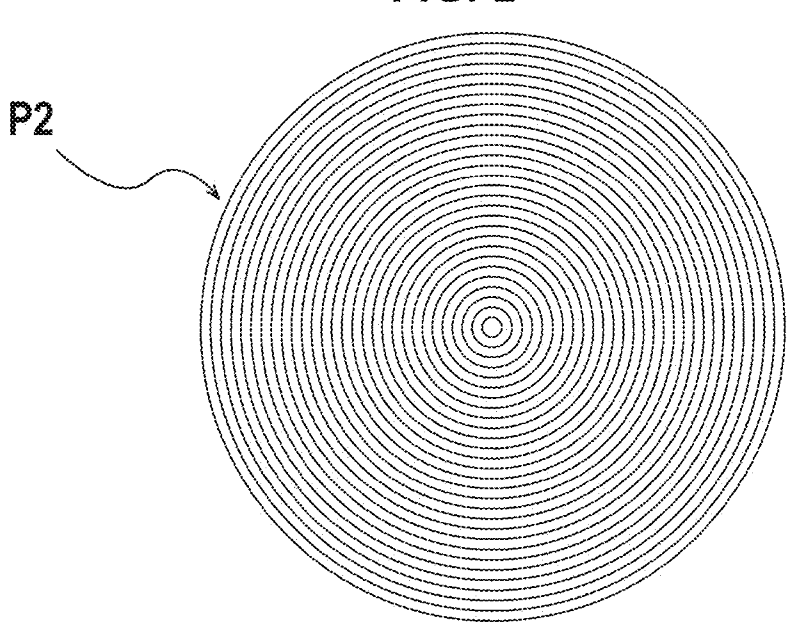
FIG. 2 is a diagram showing an example of a reference pattern of a lattice.
Figure 3:
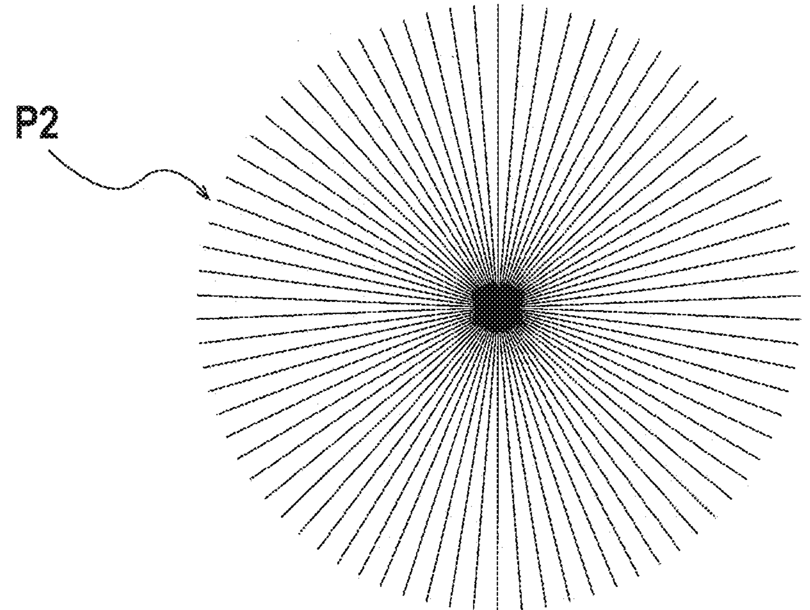
FIG. 3 is a diagram showing another example of the reference pattern of the lattice.

FIG. 2 is a diagram showing an example of the reference pattern of the lattice 24. A reference pattern P2 shown in FIG. 2 is a concentric pattern. Intervals of concentric circles are constant, and the intervals are predefined. FIG. 3 is a diagram showing another example of the reference pattern of the lattice 24. In the example shown in FIG. 3, a reference pattern P2 is a radially-extending pattern. Angles between lines are constant, and the angles are predefined.

During the polishing of the wafer W, the polishing head 1 and the wafer W rotate integrally, and the polishing pad 2 and the polishing table 3 rotate integrally. The lattice 24 and the imaging device 20 also rotate together with the polishing table 3. The imaging device 20 generates the image when the polishing head 1 and the wafer W are located above the lattice 24. More specifically, when the pattern of the wafer W and the reference pattern P2 of the lattice 24 are superimposed, the imaging device 20 captures the image including both the pattern of the wafer W and the reference pattern P2 of the lattice 24. The pattern of the wafer W and the reference pattern P2, which are superimposed, appear on the image.

Figure 4:
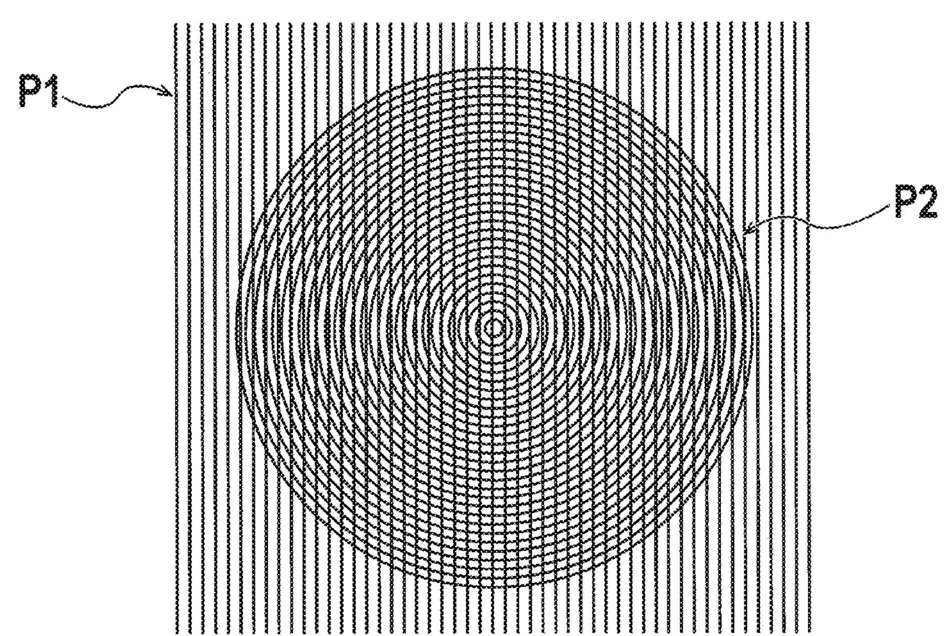
FIG. 4 is a diagram showing an example of a pattern of a wafer and the reference pattern of the lattice on an image.
Figure 5:
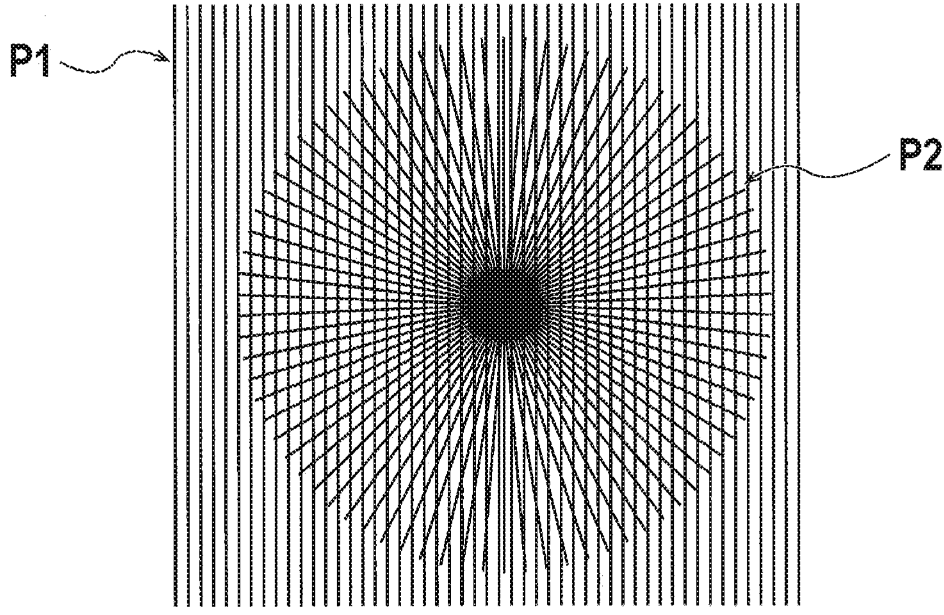
FIG. 5 is a diagram showing another example of a pattern of a wafer and the reference pattern of the lattice on an image.

FIGS. 4 and 5 are diagrams each showing a pattern P1 of the wafer W and the reference pattern P2 of the lattice 24 on the image generated by the imaging device 20. In the example shown in FIG. 4, the reference pattern P2 is the concentric pattern shown in FIG. 2, while the reference pattern P2 in the example shown in FIG. 5 is the radial pattern shown in FIG. 3. In both the examples of FIGS. 4 and 5, the pattern P1 of the wafer W is a line-and-space pattern in which straight lines are arranged at equal intervals.

As can be seen in FIGS. 4 and 5, a moire pattern appears on the image due to the superimposition of the pattern P1 of the wafer W and the reference pattern P2 of the lattice 24. The moire pattern is a pattern that appears when regular patterns are superimposed. The moire pattern may be called an interference fringe.

Geometric elements, such as a line width and a pitch, of the moire pattern are determined depending on geometric elements of the pattern P1 of the wafer W and the reference pattern P2 of the lattice 24. In other words, an unknown geometric element of the pattern P1 of the wafer W can be uniquely calculated from the geometric element of the moire pattern appearing on the image and the geometric element of the reference pattern P2 of the lattice 24. The image analysis system 30 is configured to calculate the unknown geometric element of the pattern P1 of the wafer W from the geometric element of the moire pattern appearing on the image and the geometric element of the reference pattern P2 of the lattice 24.

Figure 6:
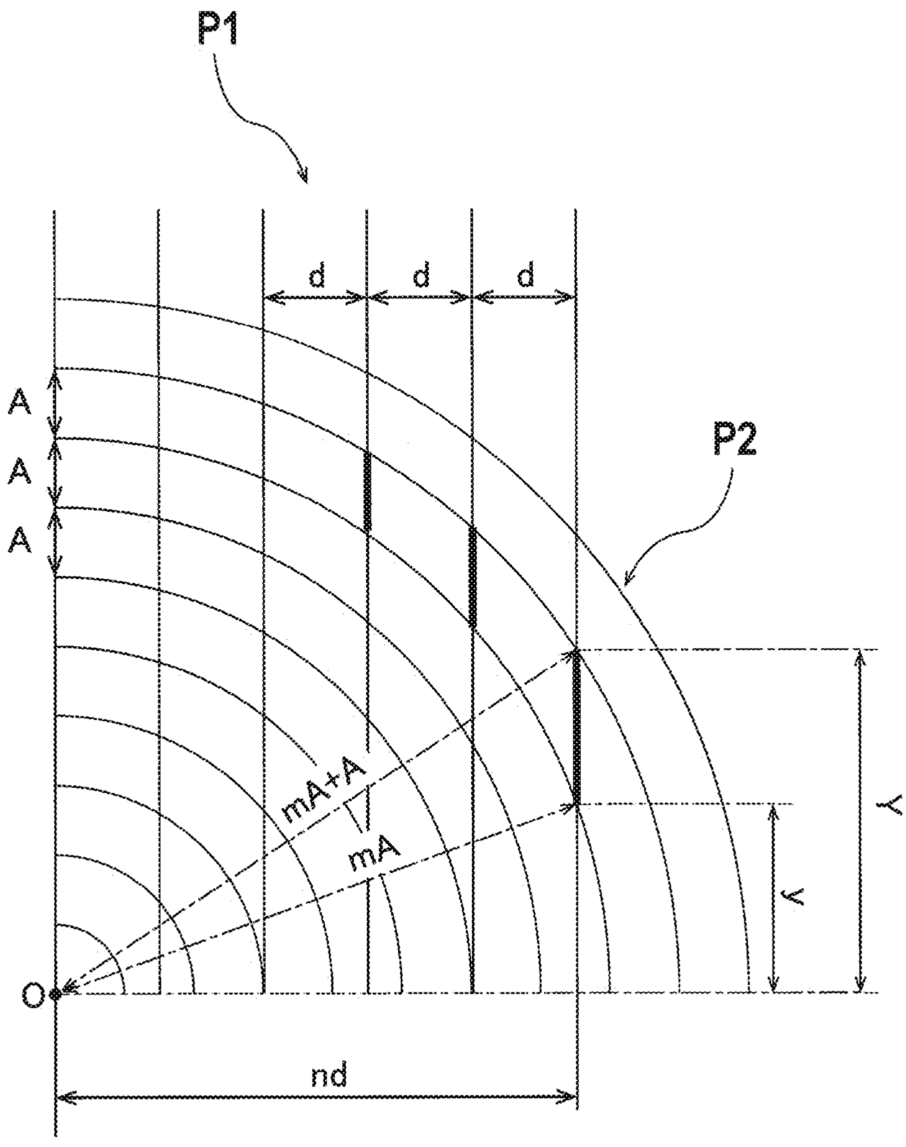
FIG. 6 is a diagram showing an example for explaining a relationship between a line width of a moire pattern and a pitch of the pattern of the wafer.

The pitch, which is one of the geometric elements of the pattern P1 of the wafer W, i.e., a distance between straight lines constituting the pattern P1, can be calculated from the line width of the moire pattern as follows. FIG. 6 is a diagram showing an example for explaining a relationship between the line width of the moire pattern and the pitch of the pattern P1 of the wafer W. The moire pattern shown in FIG. 6 is a pattern caused by the superimposition of the pattern P1 of the wafer W composed of the line-and-space pattern and the concentric reference pattern P2. Lengths of lines (indicated by thick lines in FIG. 6) connecting points where the pattern P1 of the wafer W and the reference pattern P2 intersect represent line widths of the moire pattern.

In FIG. 6, an interval between concentric circles of the reference pattern P2 is denoted by A, an inner circle of the moire pattern to be determined is denoted by m-th circle, a pitch of the pattern P1 of the wafer W composed of the line-and-space pattern is denoted by d, and a position of the moire pattern to be determined is on n-th straight line from the center O of the concentric circles. A formula for calculating the line width of the moire pattern is given as follows.

$$Y-y=\sqrt{(mA+A)^2-nd^2}-\sqrt{(mA)^2-nd^2)} \qquad (1)$$

In the above formula (1), the line width Y−y of the moire pattern and the number n of straight lines indicating the position of the moire pattern can be measured from the image generated by the imaging device 20. Specifically, the image analysis system 30 obtains the image from the imaging device 20, and measures the line width Y−y of the moire pattern on the image and the number n of straight lines indicating the position of the moire pattern. The symbol A in the above formula (1) is a predefined numerical value, and the numerical value m is uniquely determined based on the position of the line width of the moire pattern to be determined. Therefore, the image analysis system 30 can calculate the pitch d of the pattern of the wafer W by substituting the line width Y−y of the moire pattern, the numerical value of the number n of lines, and the specific numerical values of m and A into the above formula (1), and further solving the above formula (1) for d.

Figure 7:
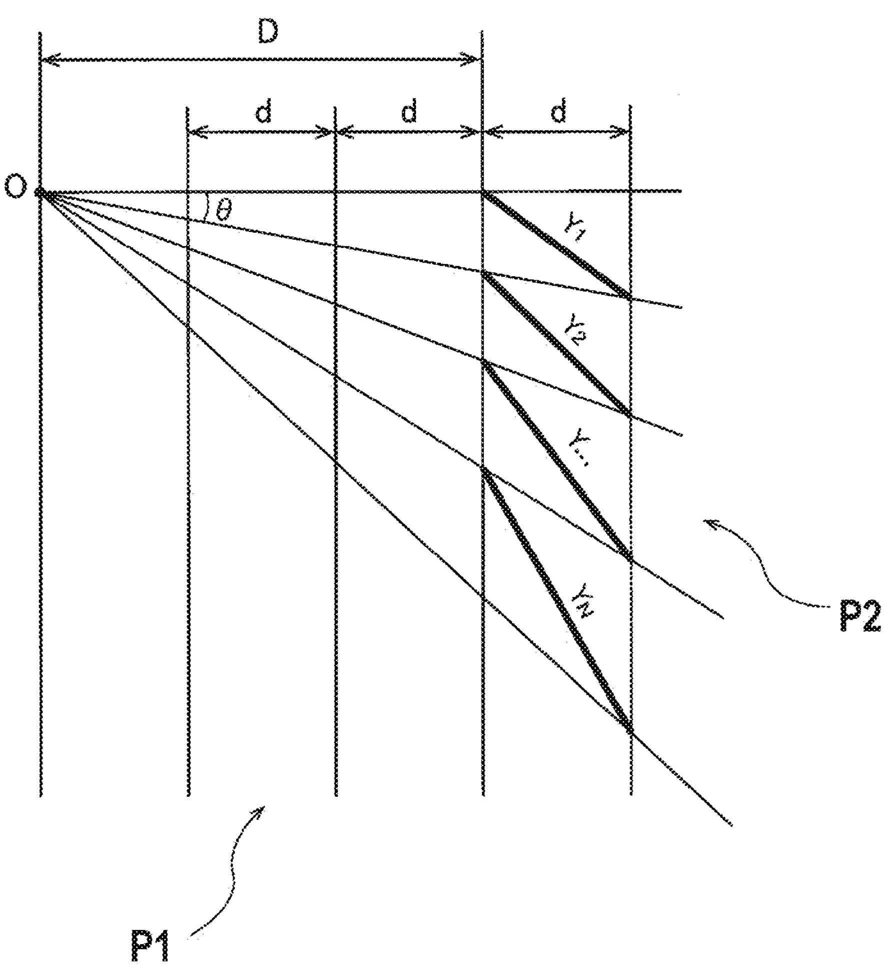
FIG. 7 is a diagram showing another example for explaining a relationship between a line width of a moire pattern and a pitch of the pattern of the wafer.

FIG. 7 is a diagram showing another example for explaining a relationship between line width of the moire pattern and pitch of the pattern P1 of the wafer W. The moire pattern shown in FIG. 7 is a pattern caused by the superimposition of the pattern P1 of the wafer W composed of the line-and-space pattern and the radial reference pattern P2. Lengths of lines (indicated by thick lines in FIG. 7) connecting points where the pattern P1 of the wafer W and the reference pattern P2 intersect represent line widths of the moire pattern.

In FIG. 7, an angle between radial lines of the reference pattern P2 is denoted by θ, a pitch of the pattern P1 of the wafer W composed of the line-and-space pattern is denoted by d, a distance from the center O of the reference pattern P2 to the moire pattern to be determined is denoted by D, and the number of the line width of the moire pattern is denoted by N. A formula for calculating the line width of the moire pattern is given as follows.

$$Y_N=\sqrt{[(D+d)\tan N\theta-D\tan(N-1)\theta]^2+d^2} \qquad (2)$$

In the above formula (2), the line width $Y_N$ of the moire pattern and the distance D can be measured from the image generated by the imaging device 20. Specifically, the image analysis system 30 obtains the image from the imaging device 20 and measures the line width $Y_N$ of the moire pattern and the distance D on the image. The symbol θ in the above formula (2) is a predefined numerical value, and the numerical value N is uniquely determined based on the position of the line width of the moire pattern to be determined. Therefore, the image analysis system 30 can calculate the pitch d of the pattern P1 of the wafer W by substituting the measured value of the line width $Y_N$ of the moire pattern and the distance D, and the specific numerical values of θ and N into the above formula (2), and further solving the above formula (2) for d.

The moire pattern changes depending on the pattern of the wafer W, and is larger than the pattern of the wafer W. Therefore, the lattice 24 functions as a pattern magnifying device that visually magnifies the pattern of the wafer W and converts the pattern of the wafer W into the moire pattern. According to the present embodiment, the lattice 24 having a simple structure installed in the polishing table 3 allows the image analysis system 30 to obtain the geometric element of the pattern of the wafer W during the polishing of the wafer W without using a precision device, such as a microscope. The operation controller 40 can optimize the polishing condition for the wafer W based on the geometric element of the pattern of the wafer W.

As shown in FIG. 1, the image analysis system 30 is coupled to the operation controller 40. The geometric element of the pattern of the wafer W calculated (determined) by the image analysis system 30 is transmitted to the operation controller 40. The operation controller 40 optimizes the polishing condition for the wafer W based on the geometric element of the pattern of the wafer W transmitted from the image analysis system 30. For example, the operation controller 40 optimizes a polishing load applied to the wafer W by the polishing head 1 based on the geometric element of the pattern of the wafer W.

During the polishing of the wafer W, the wafer W rotates about its axis. According to the concentric or radial reference pattern shown in FIGS. 2 and 3, the same moire pattern appears on the image regardless of a rotation angle of the wafer W. Therefore, the image analysis system 30 can determine the accurate geometric element of the pattern of the wafer W based on the moire pattern. In one embodiment, the imaging device 20 may generate the image while the rotations of the polishing head 1 and the polishing table 3 are stopped before polishing of the wafer W is started. In this case, the reference pattern may be a line-and-space pattern or a concentric elliptical pattern.

In the case of the reference pattern having the concentric circles shown in FIG. 6, as can be seen from the above formula (1), in order to calculate the pitch d of the pattern of the wafer W, the number n of straight lines of the pattern of the wafer W indicating the position of the moire pattern must be obtained from the image. Therefore, the reference pattern having the concentric circles is suitable when the pitch of the pattern of the wafer W is large to a certain degree. On the other hand, in the case of the reference pattern constituted by the radial pattern shown in FIG. 7, the number n of straight lines of the pattern of the wafer W is not included in the above formula (2). Therefore, the reference pattern constituted by the radial pattern is suitable when the pitch of the pattern of the wafer W is fine.

Figure 8:
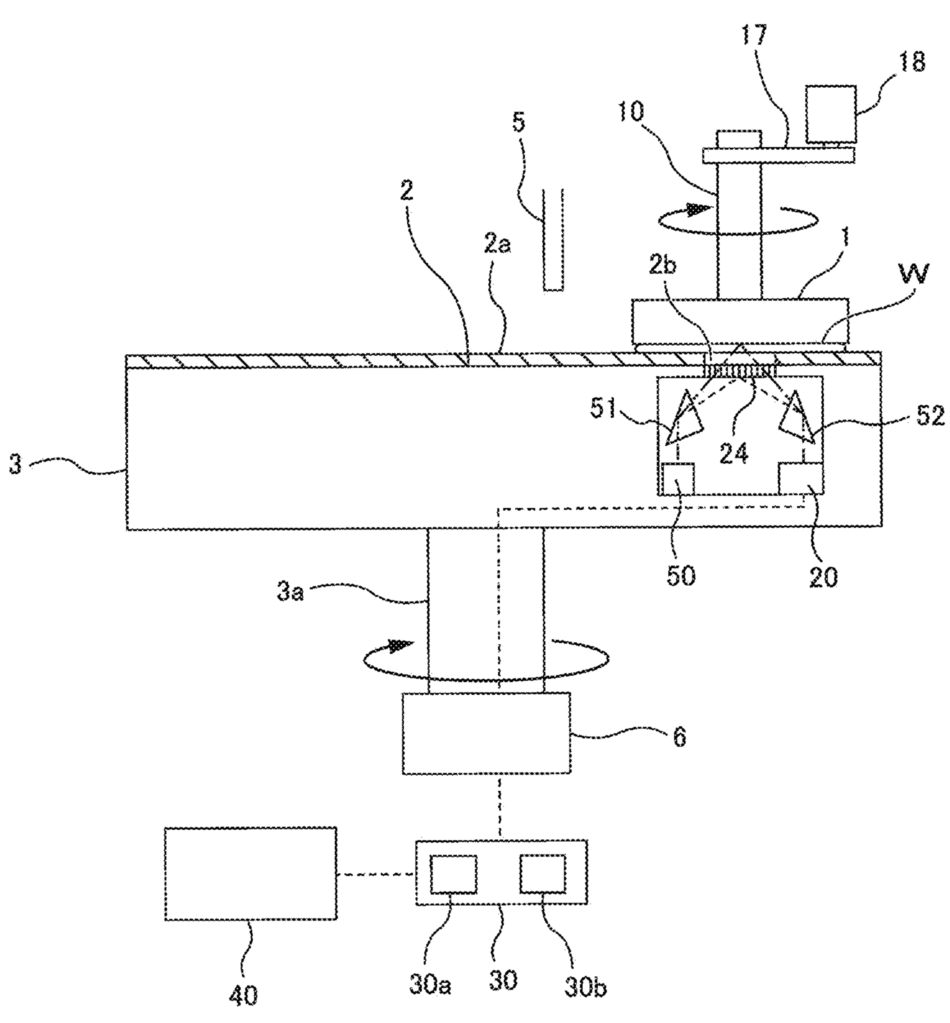
FIG. 8 is a diagram showing another embodiment of the polishing apparatus.

FIG. 8 is a diagram showing another embodiment of the polishing apparatus. Configurations and operations of this embodiment, which will not be particularly described, are the same as those of the embodiment shown in FIG. 1, and duplicated descriptions will be omitted. The polishing apparatus further includes a light source 50, a first prism 51, and a second prism 52. The light source 50, the first prism 51, the second prism 52, the lattice 24, and the imaging device 20 are disposed in the polishing table 3, and rotate together with the polishing table 3. The relative positions of the light source 50, the first prism 51, the second prism 52, the lattice 24, and the imaging device 20 are fixed.

The first prism 51 and the second prism 52 are arranged symmetrically with respect to the lattice 24, and are located below the lattice 24. The light source 50 is arranged so as to face the first prism 51, and the imaging device 20 is arranged so as to face the second prism 52. The light source 50 is a white light source. More specifically, the light source 50 includes a light-emitting diode configured to emit a white light. A convergence lens may be disposed between the light source 50 and the first prism 51. Similarly, a convergence lens may be disposed between the imaging device 20 and the second prism 52.

When the white light, emitted by the light source 50, passes through the first prism 51, the white light is split into a first light (e.g., red light) that passes through the lattice 24 to the surface of the wafer W and a second light (e.g., blue light) that is reflected by the lattice 24, due to the difference in refractive index. The first light is reflected by the surface (patterned surface) of the wafer W after passing through the lattice 24, passes through the second prism 52 after passing through the lattice 24 again, and is incident on the imaging device 20. The second light is reflected by the lattice 24, and is incident on the imaging device 20 after passing through the second prism 52. The first light and the second light that have passed through the second prism 52 are superimposed and are incident on the imaging device 20. The imaging device 20 generates an image from the first light and the second light. A moire pattern appears on this image. The image analysis system 30 can calculate the pitch of the pattern of the wafer W by analyzing the moire pattern on the image, as in the embodiment described above.

Figure 9:
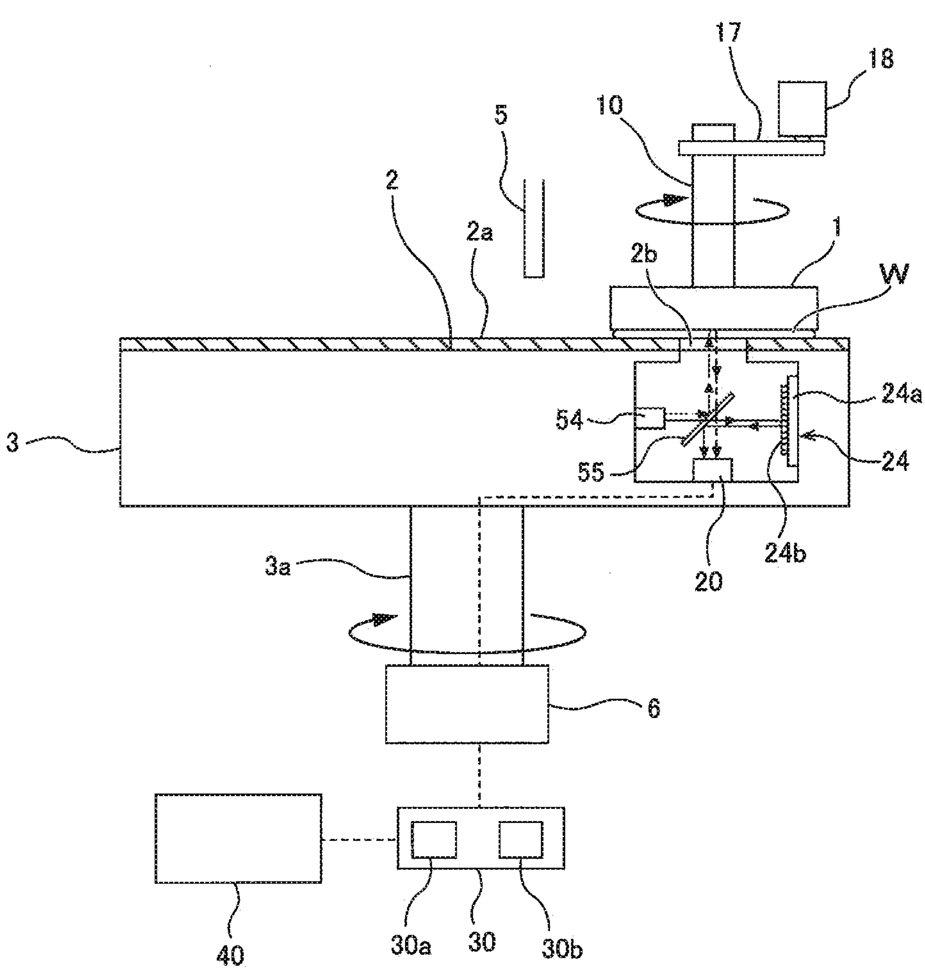
FIG. 9 is a diagram showing still another embodiment of the polishing apparatus.

FIG. 9 is a diagram showing still another embodiment of the polishing apparatus. Configurations and operations of this embodiment, which will not be particularly described, are the same as those of the embodiment shown in FIG. 1, and duplicated descriptions will be omitted. The polishing apparatus further includes a light source 54 and a beam splitter 55. The light source 54 and the beam splitter 55 are disposed in the polishing table 3, and rotate together with the polishing table 3. The beam splitter 55 may include a half mirror. The relative positions of the light source 54, the beam splitter 55, the lattice 24, and the imaging device 20 are fixed.

The lattice 24 is not aligned with the through-hole **2*b* and the imaging device 20. The lattice 24 and the light source 54 are arranged symmetrically with respect to a straight line connecting the through-hole 2*b* and the imaging device 20. The beam splitter 55 is disposed between the through-hole 2*b* and the imaging device 20, and is arranged obliquely with respect to the straight line connecting the through-hole 2*b* and the imaging device 20. The light source 54 and the lattice 24 are arranged symmetrically with respect to the beam splitter 55. The light source 54 faces one surface of the beam splitter 55, and the lattice 24 is arranged on an optical axis of the light source 54. The lattice 24 has a reflector 24*a* and a patterned layer 24*b*. The patterned layer 24*b* is fixed to a front surface of the reflector 24*a*, and a reference pattern is formed in the patterned layer 24*b***.

The light, emitted by the light source 54, is split into a first light reflected by the beam splitter 55 and a second light passing through the beam splitter 55. The first light passes through the through-hole **2*b* and is incident on the surface (patterned surface) of the wafer W. The first light is reflected by the surface of the wafer W, passes through the beam splitter 55, and is incident on the imaging device 20. The second light passes through the beam splitter 55 and is incident on the lattice 24. The second light is reflected by the lattice 24, further reflected by the beam splitter 55, and is then incident on the imaging device 20**.

The first light reflected by the wafer W and the second light reflected by the lattice 24 are superimposed, and are incident on the imaging device 20. The imaging device 20 generates an image from the first light and the second light. A moire pattern appears on this image. The image analysis system 30 can calculate the pitch of the pattern of the wafer W by analyzing the moire pattern on the image, as in the embodiment described above.

In each of the above-described embodiments, the geometric element of the pattern of the wafer W is calculated based on the geometric element (e.g., line width) of the moire pattern on the image. In one embodiment, the image analysis system 30 may be configured to obtain an image from the imaging device 20, compare a moire pattern on the image with reference moire patterns on a plurality of reference images stored in a database, determine a reference image having a reference moire pattern that most matches the moire pattern on the image, and determine a geometric element of a pattern associated with the determined reference image. This embodiment will be described below.

Figure 10:
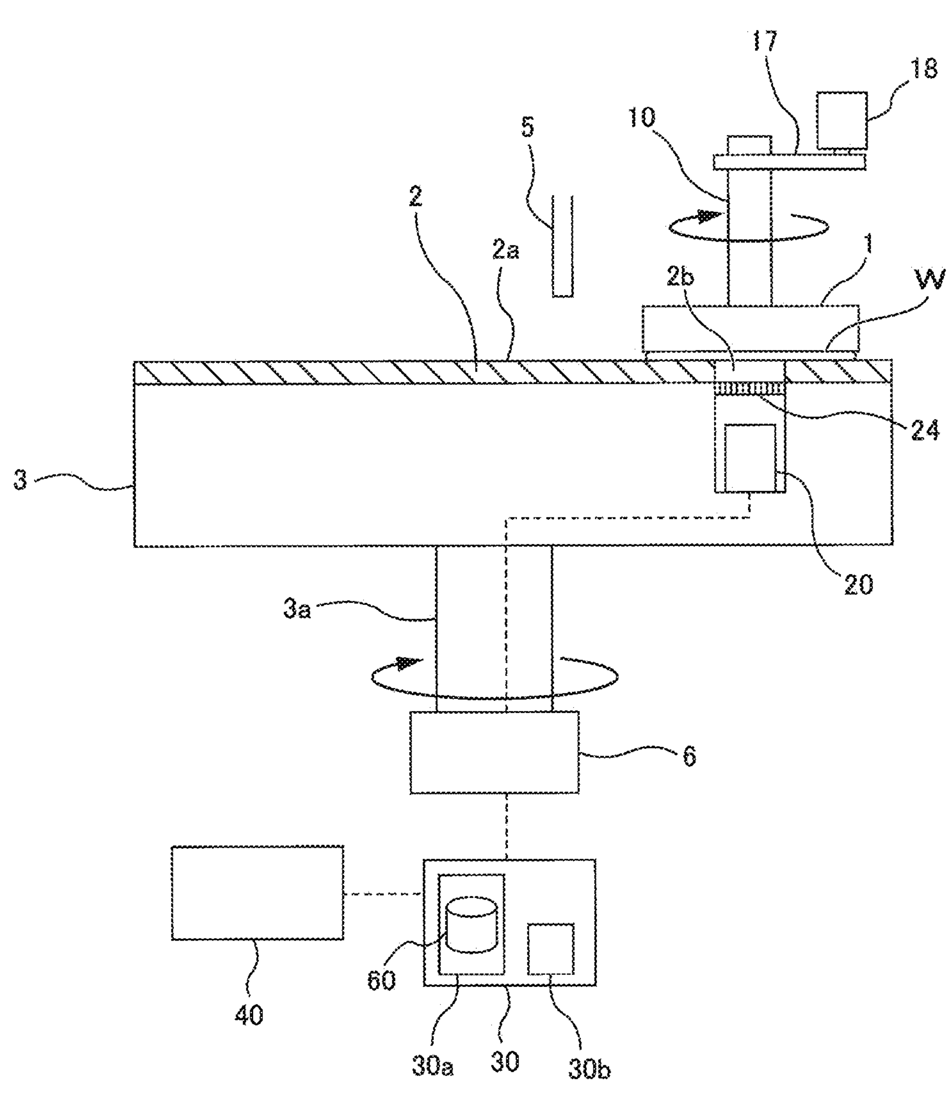
FIG. 10 is a diagram showing an embodiment of the polishing apparatus having a database storing a plurality of reference images therein.

FIG. 10 is a diagram showing an embodiment of the polishing apparatus having a database storing a plurality of reference images therein. Configurations and operations of this embodiment, which will not be particularly described, are the same as those of the embodiment shown in FIG. 1, and duplicated descriptions will be omitted.

As shown in FIG. 10, the image analysis system 30 includes a database 60 stored in the memory 30*a*. The database 60 stores a plurality of reference images which are generated when a plurality of reference wafers (reference workpieces) having different patterns formed thereon are polished using the polishing apparatus shown in FIG. 10. A moire pattern appears on each reference image. The moire pattern varies depending on a geometric element of a pattern of each reference wafer and a geometric element of the reference pattern of the lattice 24.

Geometric elements (e.g., pitches) of the patterns of the plurality of reference wafers used for generating the reference images are measured in advance by a magnifying device, such as an electron microscope or an optical microscope (not shown). The geometric elements of these patterns of the reference wafers are input to the database 60, and stored in the database 60, with the geometric elements associated (or connected) with the corresponding reference images.

Figure 11:
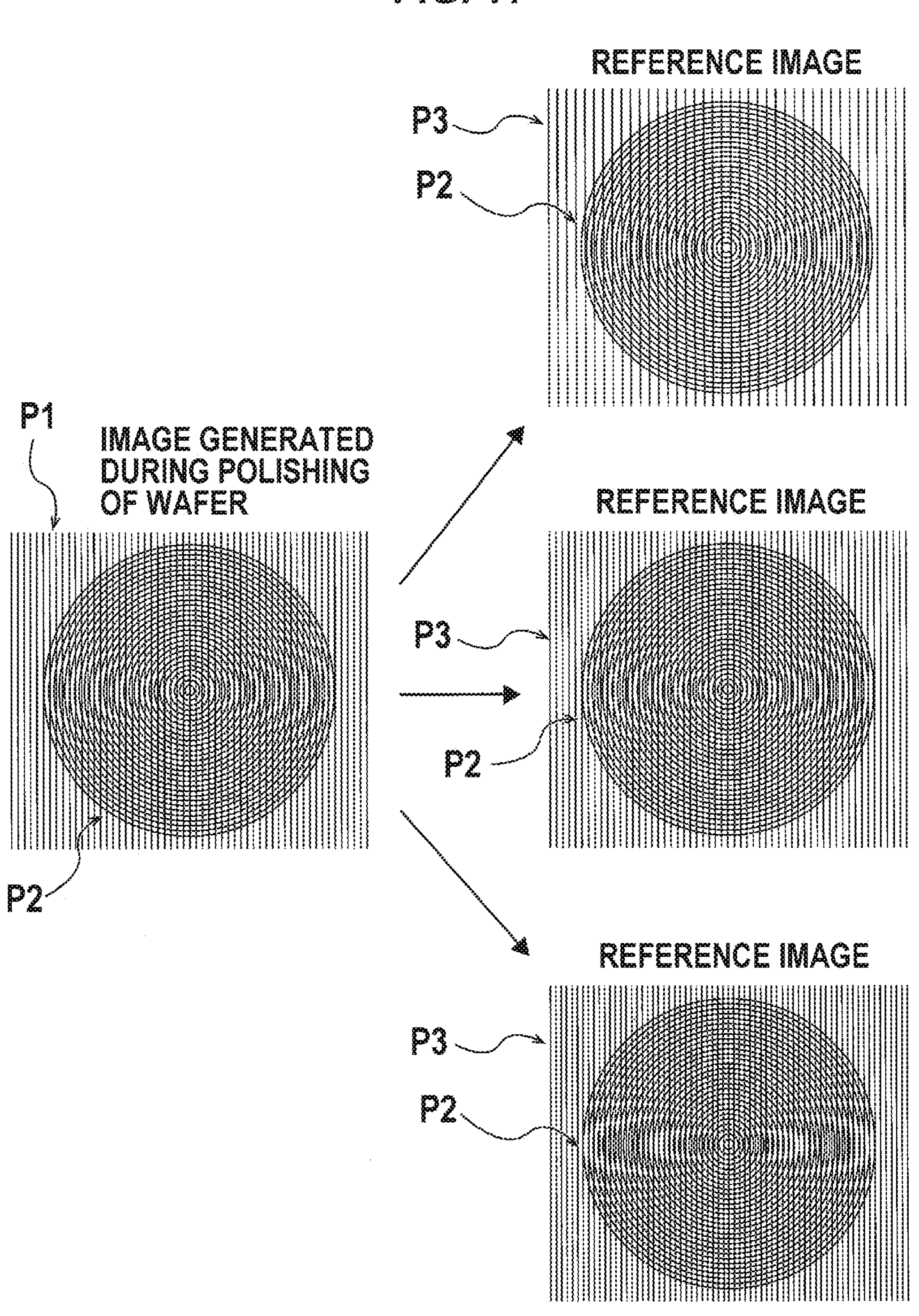
FIG. 11 is a diagram illustrating a process of comparing a moire pattern on an image with reference moire patterns on reference images.

FIG. 11 is a diagram illustrating a process of comparing the moire pattern on the image generated during polishing of a wafer W with the reference moire patterns on the plurality of reference images. The reference pattern P2 of the lattice 24 is the same among the plurality of reference images, but patterns P3 of reference wafers are different. As a result, different reference moire patterns appear on the plurality of reference images.

As shown in FIG. 11, the image analysis system 30 compares the moire pattern appearing on the image generated during polishing of the wafer W having the pattern P1 with the reference moire patterns on the plurality of reference images one by one. The image analysis system 30 determines a reference image having a reference moire pattern that most matches the moire pattern on the image generated during the polishing of the wafer W, and determines a geometric element of a pattern associated with the determined reference image. The comparison between the moire pattern on the image and the reference moire pattern is performed using a known image processing algorithm, such as pattern matching.

In one embodiment, the imaging device 20 may generate the image while the rotations of the polishing head 1 and the polishing table 3 are stopped before polishing of the wafer W is started. In this case, the reference pattern may be a line-and-space pattern or a concentric elliptical pattern. The embodiments described with reference to FIGS. 10 and 11 can be applied to the embodiment shown in FIG. 8 and the embodiment shown in FIG. 9 described above.

In each of the above-described embodiments, the lattice 24 is used as the pattern magnifying device, but in another embodiment, a magnifying glass having a combination of lenses may be used as the pattern magnifying device.

Next, an embodiment of determining a polishing end point of a wafer, which is an example of a workpiece, based on an image generated by the imaging device will be described. Configurations and operations of this embodiment, which will not be particularly described, are the same as those of the embodiments shown in FIGS. 1 to 11, and duplicated descriptions will be omitted.

The image analysis system 30 is configured to determine a polishing end point of a wafer W based on an image generated by the imaging device 20. More specifically, as will be described later, the image analysis system 30 includes memory 30*a* storing therein programs for determining the polishing end point of the wafer W based on an image generated by the imaging device 20, and arithmetic device 30*b* configured to perform arithmetic operations according to instructions contained in the programs. The operation controller 40 is configured to terminate the polishing of the wafer W upon receiving a signal indicating the polishing end point of the wafer W from the image analysis system 30.

The moire patterns as shown in FIGS. 4 and 5 occur when the pattern P1 of the wafer W appears on the surface of the wafer W. In other words, when the pattern P1 of the wafer W is covered with a film, the moire pattern does not appear on the image.

Figure 12A:
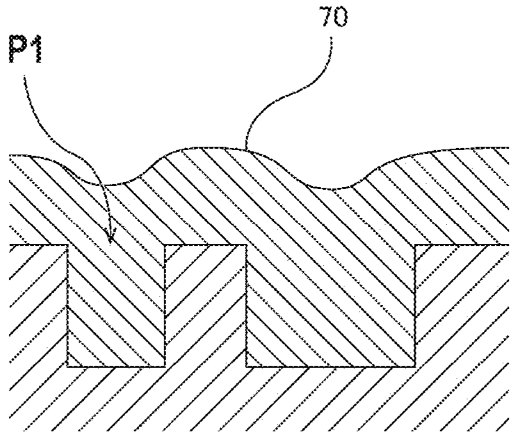
FIG. 12A is a diagram showing an example of a cross-sectional structure of a wafer.
Figure 12B:
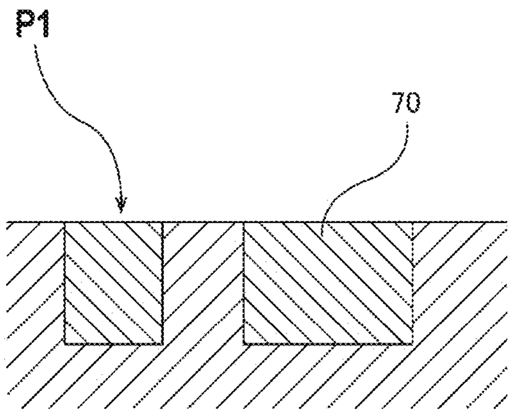
FIG. 12B is a diagram showing an example of a cross-sectional structure of the wafer.

FIGS. 12A and 12B are diagrams each showing an example of a cross-sectional structure of the wafer W. As shown in FIG. 12A, in an interconnect forming process, such as a damascene method, a film 70 (for example, a metal film, such as copper) is formed on the pattern P1 constituted by interconnect grooves. When the film 70 is polished by the polishing apparatus shown in FIG. 1, the pattern P1 appears on the surface of the wafer W as shown in FIG. 12B. The polishing end point of the wafer W is a point in time at which an excessive portion of the film 70 is removed by the polishing and the pattern P1 has clearly appeared.

As can be seen from FIG. 12A, when the pattern P1 is covered with the film 70, the pattern P1 of the wafer W and the reference pattern P2 of the lattice 24 are not superimposed on the image generated by the imaging device 20. Therefore, the moire pattern does not appear on the image. In contrast, as shown in FIG. 12B, when the excessive portion of the film 70 is removed, the pattern P1 of the wafer W appears on the image. As a result, the pattern P1 of the wafer W and the reference pattern P2 of the lattice 24 are superimposed, and the moire pattern appears on the image.

The image analysis system 30 is configured to determine the polishing end point of the wafer W based on the moire pattern appearing on the image due to the superimposition of the pattern P1 of the wafer W and the reference pattern P2 of the lattice 24. In the present embodiment, the image analysis system 30 determines the polishing end point of the wafer W based on a sharpness of the moire pattern on the image. More specifically, the image analysis system 30 determines the polishing end point at which the sharpness of the moire pattern no longer changes.

The sharpness of the moire pattern can be expressed by an index numerical value. In one embodiment, the sharpness of the moire pattern is an index numerical value expressed by a modulation transfer function. The index numerical value expressed by the modulation transfer function is also called an MTF value. The MTF value rises as the moire pattern appears clearly. During the polishing of the wafer W, the imaging device 20 successively generates images of the surface (surface to be polished) of the wafer W and the reference pattern P2 of the lattice 24, and the image analysis system 30 obtains the images from the imaging device 20 and calculates the index numerical value indicating the sharpness of the moire pattern on each of the images.

Figure 13:
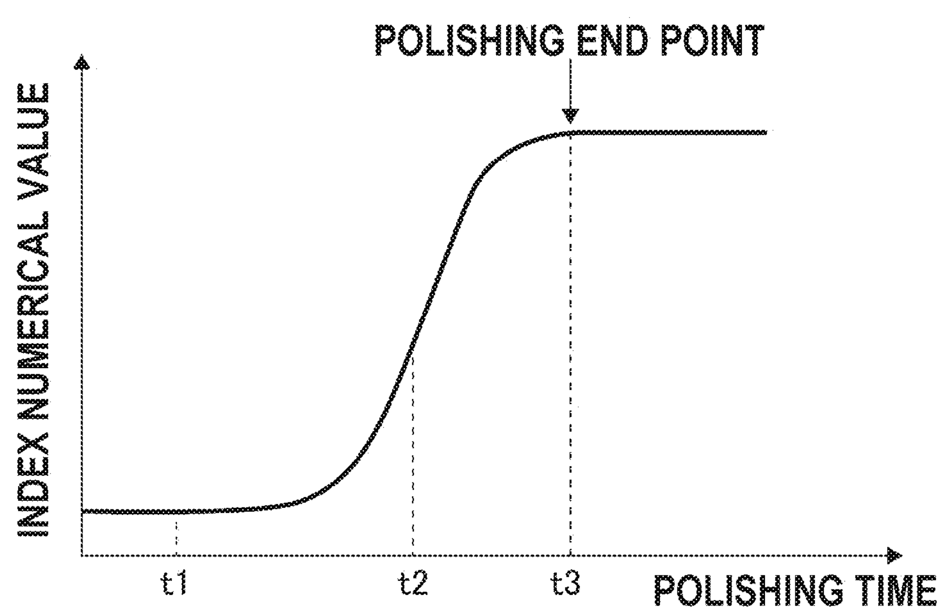
FIG. 13 is a graph showing a change in index numerical value indicating a sharpness of a moire pattern on an image when the wafer shown in FIG. 12A is being polished.

FIG. 13 is a graph showing a change in the index numerical value indicating the sharpness of the moire pattern on the image during the polishing of the wafer W shown in FIG. 12A. In FIG. 13, vertical axis represents the index numerical value (e.g., the MTF value), and horizontal axis represents polishing time. As shown in FIG. 13, in an initial stage of polishing, the pattern P1 of the wafer W is covered with the film 70 (see FIG. 12A), and therefore the moire pattern does not appear on the image (time t1). As the polishing of the wafer W progresses, the film 70 is gradually removed, and the pattern P1 of the wafer W begins to appear (time t2). At this time, the moire pattern also gradually begins to appear on the image, although the moire pattern is not clear.

When the excessive portion of the film 70 is completely removed (see FIG. 12B), the pattern P1 of the wafer W appears clearly (time t3). As a result, the moire pattern appears clearly on the image due to the superimposition of the pattern P1 of the wafer W and the reference pattern P2 of the lattice 24. This time t3 is the polishing end point of the wafer W. After that, the sharpness of the moire pattern on the image hardly changes, and as a result, the index numerical value is almost constant.

Since the index numerical value changes characteristically in this manner during the polishing of the wafer W, the image analysis system 30 can determine the polishing end point of the wafer W based on the change in the index numerical value. More specifically, the image analysis system 30 determines the polishing end point at which the index numerical value rises and then the index numerical value becomes substantially constant. In the present embodiment, as described below, the image analysis system 30 determines the polishing end point based on a rate of change in the index numerical value.

Figure 14:
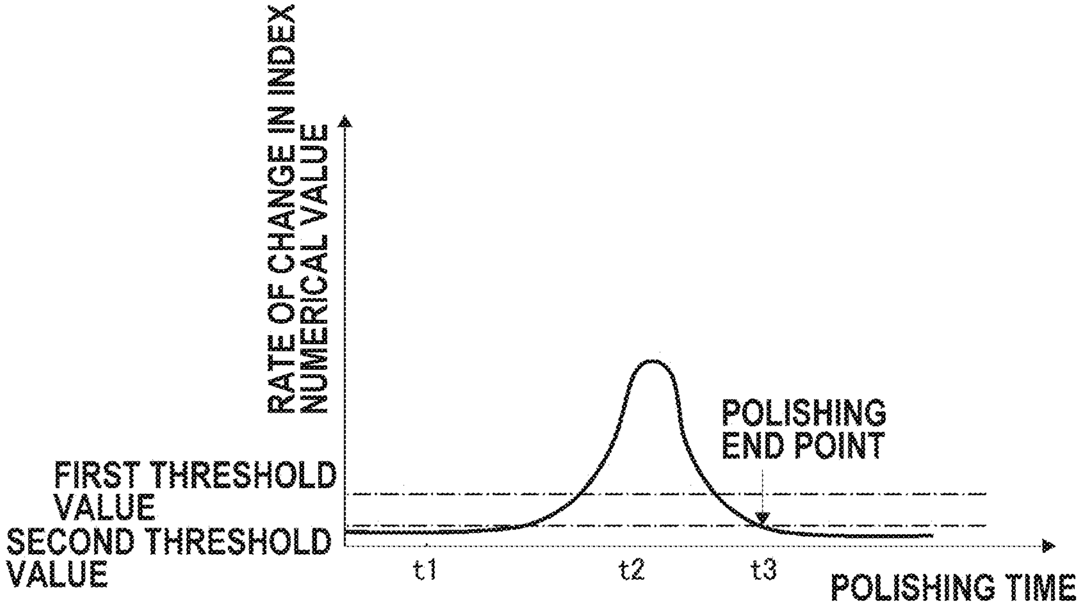
FIG. 14 is a graph showing a rate of change in the index numerical value.

FIG. 14 is a graph showing the rate of change in the index numerical value. In FIG. 14, vertical axis represents the rate of change (absolute value) in the index numerical value, and horizontal axis represents the polishing time. The rate of change in the index numerical value is an amount of change in the index numerical value per unit time, and represents a slope of the graph of the index numerical value shown in FIG. 13. The unit time is, e.g., the time required for the polishing table 3 to make N rotation(s) (N is a natural number, e.g., N=1). As shown in FIG. 14, the rate of change in the index numerical value once rises to reach a maximum value, then decreases, and eventually becomes substantially constant. The image analysis system 30 is configured to calculate the rate of change in the index numerical value during the polishing of the wafer W, detect a point in time at which the rate of change exceeds a first threshold value, and then determine the polishing end point at which the rate of change falls below a second threshold value. The first threshold value may be the same as or different from the second threshold value.

In one embodiment, the image analysis system 30 may be configured to calculate a moving average of the rate of change (absolute value) in the index numerical value, detect a point in time at which the moving average exceeds the first threshold value, and then determine the polishing end point at which the moving average falls below the second threshold value.

As shown in FIG. 1, the image analysis system 30 is coupled to the operation controller 40. The signal indicating the polishing end point of the wafer W determined by the image analysis system 30 is transmitted to the operation controller 40. When the operation controller 40 receives the signal transmitted from the image analysis system 30, the operation controller 40 terminates polishing of the wafer W.

As can be seen from the graph of FIG. 13, the index numerical value indicating the sharpness of the moire pattern on the image corresponds to a thickness of the film 70 (see FIG. 12A). Therefore, the imaging device 20 may generate a plurality of images of the pattern of the wafer W and the reference pattern P2, which are superimposed, at a plurality of measurement points on the wafer W each time the polishing table 3 makes one rotation. The image analysis system 30 may obtain the plurality of images from the imaging device 20, calculate a plurality of index numerical values indicating the sharpnesses of the moire pattern on the plurality of images, and produce a film-thickness profile of the wafer W from the plurality of index numerical values. This film-thickness profile can be used to optimize the polishing condition for the wafer W. For example, the operation controller 40 optimizes the polishing load applied to the wafer W by the polishing head 1 based on the film-thickness profile of the wafer W.

In one embodiment, the lattice 24 may have superimposed reference patterns. When the superimposed reference patterns are used, the moire pattern on the image becomes large, and thus the image analysis system 30 may easily calculate the index numerical value indicating the sharpness of the moire pattern.

The embodiment shown in FIG. 8 and the embodiment shown in FIG. 9 described above can be applied to the embodiments described with reference to FIGS. 12A to 14. In these cases also, the image analysis system 30 can determine the polishing end point of the wafer W based on the moire pattern on the image, as in the previously described embodiments.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a polishing apparatus and a polishing method for detecting a geometric element of a pattern, such as pitch. Further, the present invention is applicable to a technique of determining a polishing end point of a workpiece.

REFERENCE SIGNS LIST

1 polishing head
2 polishing pad

**2*b*** through-hole
3 polishing table
**3*a*** table shaft
5 slurry supply nozzle
6 table motor
10 head shaft
17 coupling device
18 polishing-head motor
20 imaging device
24 lattice
30 image analysis system
**30*a*** memory
**30*b*** arithmetic device
40 operation controller
50 light source
51 first prism
52 second prism
54 light source
55 beam splitter
60 database
70 film

The invention claimed is:

1. A polishing apparatus comprising:

a polishing table configured to support a polishing pad;

a polishing head configured to press a workpiece, having a pattern formed thereon, against the polishing pad and polish a surface of the workpiece;

an imaging device disposed in the polishing table and configured to generate an image including at least the pattern of the workpiece;

an image analysis system configured to determine a geometric element of the pattern of the workpiece based on the image; and a lattice having a reference pattern formed therein, the reference pattern having a predefined shape and dimensions, wherein the lattice is disposed on the polishing table between the imaging device and the surface of the workpiece, wherein the imaging device captures an image of the pattern of the workpiece through the lattice, and wherein the image analysis system is configured to measure a line width of a moire pattern appearing on the image due to superimposition of the pattern of the workpiece and the reference pattern and calculate a pitch of the pattern of the workpiece from the line width of the moire pattern.

2. The polishing apparatus according to claim 1, wherein the image analysis system is configured to:

obtain the image from the imaging device;

compare the moire pattern on the image with reference moire patterns on a plurality of reference images;

determine a reference image having a reference moire pattern that most matches the moire pattern on the image; and determine a geometric element of a pattern associated with the determined reference image.

3. The polishing apparatus according to claim 1, further comprising:

a first prism and a second prism disposed in the polishing table; and a light source facing the first prism, wherein the imaging device faces the second prism, the first prism is arranged so as to split light emitted by the light source into a first light that passes through the lattice to the workpiece and a second light that is reflected by the lattice, and the second prism is arranged so as to superimpose the first light reflected by the workpiece and the second light reflected by the lattice, and to direct the first light and the second light, which are superimposed, to the imaging device.

4. The polishing apparatus according to claim 1, further comprising a beam splitter and a light source disposed in the polishing table, wherein the light source and the lattice are arranged symmetrically with respect to the beam splitter, the imaging device faces the beam splitter, and the beam splitter is arranged so as to split light emitted by the light source into a first light reflected by the beam splitter and a second light passing through the beam splitter, direct the first light to the workpiece, and direct the second light to the lattice.

5. The polishing apparatus according to claim 1, wherein the reference pattern is a concentric pattern or a radial pattern.

* * * * *